(12) United States Patent
Tanaka et al.

(10) Patent No.: US 8,372,577 B2
(45) Date of Patent: Feb. 12, 2013

(54) PHOTOSENSITIVE RESIN COMPOSITIONS AND PHOTOSENSITIVE DRY FILMS USING THE SAME

(75) Inventors: Yukihiko Tanaka, Kanagawa (JP); Shinkichi Asahi, Kanagawa (JP); Naoya Katsumata, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/801,451

(22) Filed: Jun. 9, 2010

(65) Prior Publication Data

US 2011/0065046 A1 Mar. 17, 2011

Related U.S. Application Data

(63) Continuation of application No. 12/588,546, filed on Oct. 19, 2009, now abandoned, which is a continuation of application No. 12/379,243, filed on Feb. 17, 2009, now abandoned, which is a continuation of application No. 11/907,619, filed on Oct. 15, 2007, now abandoned, which is a continuation of application No. 10/575,755, filed as application No. PCT/JP2004/015640 on Oct. 14, 2004, now abandoned.

(30) Foreign Application Priority Data

Oct. 15, 2003 (JP) ................................ 2003-355032

(51) Int. Cl.
*G03F 7/031* (2006.01)
*G03F 7/033* (2006.01)
*G03F 7/11* (2006.01)

(52) U.S. Cl. .................. 430/273.1; 430/285.1; 430/910; 430/920; 430/292; 522/50

(58) Field of Classification Search ........................ None
See application file for complete search history.

(56) References Cited

U.S. PATENT DOCUMENTS

| | | | | |
|---|---|---|---|---|
| 3,445,229 A | * | 5/1969 | Webers | 430/255 |
| 3,737,410 A | * | 6/1973 | Muller | 525/504 |
| 3,843,384 A | * | 10/1974 | Adachi et al. | 503/201 |
| 4,139,391 A | * | 2/1979 | Ikeda et al. | 430/276.1 |
| 4,411,983 A | * | 10/1983 | Washizawa et al. | 430/325 |
| 4,529,681 A | * | 7/1985 | Usami et al. | 430/138 |
| 4,629,680 A | * | 12/1986 | Iwasaki et al. | 430/288.1 |
| 5,030,548 A | | 7/1991 | Fujikura et al. | |
| 5,085,973 A | * | 2/1992 | Shimizu et al. | 430/271.1 |
| 5,096,799 A | | 3/1992 | Fujikura et al. | |
| 5,397,678 A | | 3/1995 | Sato et al. | |
| 5,780,203 A | | 7/1998 | Sato et al. | |

FOREIGN PATENT DOCUMENTS

| | | |
|---|---|---|
| JP | 52-99810 | 8/1977 |
| JP | 2-48664 | 2/1990 |
| JP | 3-6202 | 1/1991 |
| JP | 3-205404 | 9/1991 |
| JP | 5-173330 | 7/1993 |
| JP | 7-248623 | 9/1995 |
| JP | 09-90628 A * | 4/1997 |
| JP | 09-101619 A * | 4/1997 |
| JP | 2001-117237 | 4/2001 |
| JP | 2002-322380 | 11/2002 |
| JP | 2003-43692 | 2/2003 |
| JP | 2003-186185 | 7/2003 |
| JP | 2004-163917 | 6/2004 |
| WO | 01/92957 | 12/2001 |

OTHER PUBLICATIONS

English translation of JP, 09-101619, A (1997) from machine translation from AIPN Japan Patent Office National center for Industrial Property Information and Training, generated Jul. 16, 2011, 7 pages.*
AN 1997:380446, ACS on STN database, file CAPLUS, English abstract of JP 09101619 A, Mori et al, entered in STN Jun. 18, 1997, 2 pages.*
English translation of JP, 09-90628, A (1997) from machine translation from AIPN Japan Patent Office National center for Industrial Property Information and Training, generated Jul. 16, 2011, 10 pages.*
Derwent-Acc-No. 1991-306957, English abstract of JP 26990115 B2, Fujikura et al, Derwent Information LTD, from Derwent Week-199808, 2 pages printed Oct. 28, 2011 from Derwent file of East database.*
Jenkins et al "Glossary of Basic Terms in Polymer Science".International Union of Pure and Applied Chemistry Macromolecular Division Commission on Macromolecular Nomenclature, (IUPAC Recommendations 1996). from © 1996 IUPAC, Pure and Applied Chemistry 68, 2287-2311.*
Derwent-Acc-No. 1991-306957, English abstract of JP 2699015 B2, Fujikura et al., Derwent Information LTD, from Derwent Week-199808, 2 pages printed Oct. 28, 2011 from Derwent file of East database.

* cited by examiner

*Primary Examiner* — Cynthia Hamilton
(74) *Attorney, Agent, or Firm* — Wenderoth, Lind & Ponack, L.L.P.

(57) ABSTRACT

It is disclosed a photosensitive resin composition comprising (a) a binder polymer based on a copolymer containing benzyl (meth)acrylate as a building block, (b) a photopolymerizable compound having at least one polymerizable ethylenically unsaturated group in the molecule and (c) a photopolymerization initiator based on a hexarylbisimidazole compound, with a light-initiated color former being optionally contained as component (d). The composition has long-term keeping quality, exhibits particularly high resistance to plating and dry etching, as well as assuring improvement in resolution and adhesion; the composition may be used to form a photosensitive dry film.

3 Claims, 1 Drawing Sheet

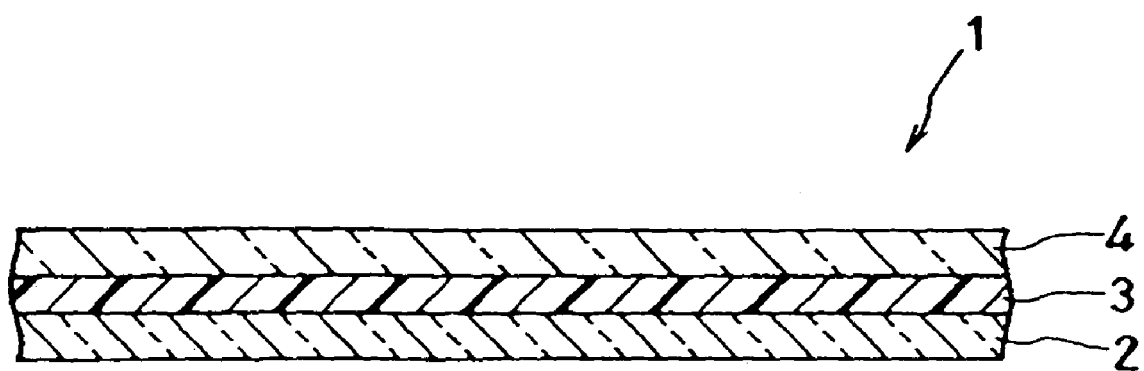

PHOTOSENSITIVE RESIN COMPOSITIONS AND PHOTOSENSITIVE DRY FILMS USING THE SAME

This is a continuation of Ser. No. 12/588,546, filed Oct. 19, 2009 now abandoned, which is a continuation of Ser. No. 12/379,243, filed Feb. 17, 2009, now abandoned, which is a continuation of Ser. No. 11/907,619, filed Oct. 15, 2007, now abandoned, which is a continuation of Ser. No. 10/575,755, now abandoned, which is a US National Stage of International Application No. PCT/JP04/15640, filed Oct. 14, 2004.

TECHNICAL FIELD

This invention relates to photosensitive resin compositions, as well as photosensitive dry films using the same. The invention is applicable with advantage to the manufacture of semiconductor devices, such as printed boards and plastic packages.

BACKGROUND ART

Semiconductor devices, such as printed boards and plastic packages, are manufactured using metallized boards that are known to be fabricated by pattern formation using photosensitive dry films.

As indicated generally by numeral 1 in FIG. 1, a photosensitive dry film consists of a support film 2, a photosensitive resin layer 3 and a protective film 4 that are placed one on another to form an integral unit.

To apply the photosensitive dry film 1, the protective film 4 is peeled off and the photosensitive resin layer 3 is thermally compressed to a substrate (not shown). Then, being covered with the support film 2, the photosensitive resin layer 3 is selectively exposed. After the exposure, the support film 2 is peeled off and development is performed such that the unexposed areas of the photosensitive resin layer 3 are selectively removed to form a photosensitive resin pattern (photoresist pattern).

In the next step, with the photoresist pattern being used as a mask, the substrate is etched or those areas between adjacent elements of the photoresist pattern are plated or otherwise processed, followed by removing away the photoresist pattern to form a desired metallization on the substrate.

Since the photosensitive dry film is stored for a long period with the protective film adhering to the surface of the photosensitive resin layer, the photosensitive resin composition (the principal component of the photosensitive resin layer 3) must first be capable of withstanding prolonged storage. Other performance requirements include high enough resolution to enable the formation of fine-line photoresist patterns that are adaptive to the recent microfabrication technology, good adhesion to the work and high resistance to plating. In addition, in the manufacture of today's semiconductor devices such as printed boards and plastic packages which are seeing a growing reduction in feature size, etching is predominantly performed by dry processes using $CF_4$, $CHF_4$, He and other gases. Therefore, the photosensitive dry film is also required to have resistance to the hostile environment of dry etching.

Conventional photosensitive resin compositions that can be used in photosensitive dry films are described in JP 52-99810A and other patents.

DISCLOSURE OF INVENTION

The present invention has been accomplished under these circumstances and has as an object providing a photosensitive resin composition that exhibits particularly high resistance to plating and dry etching, as well as maintaining good properties such as high resolution and good adhesion.

Another object of the invention is to provide a photosensitive dry film using the photosensitive resin composition.

To attain its first object, the invention provides a photosensitive resin composition that comprises (a) a binder polymer based on a copolymer containing benzyl (meth)acrylate as a building block, (b) a photopolymerizable compound having at least one polymerizable ethylenically unsaturated group in the molecule and (c) a photopolymerization initiator based on a hexarylbisimidazole compound. The composition may optionally contain (d) a light-initiated color former.

To attain its second object, the invention provides a photosensitive dry film fabricated by applying the photosensitive resin composition to a support film, drying the applied composition to form a photosensitive resin layer and overlying the photosensitive resin layer with a protective film.

BRIEF DESCRIPTION OF THE DRAWING

FIG. 1 shows schematically the structure of a photosensitive dry film.

BEST MODE FOR CARRYING OUT THE INVENTION

The binder polymer as component (a) in the photosensitive resin composition of the present invention is based on a copolymer containing benzyl (meth)acrylate as a building block.

The following are exemplary monomers that can be polymerized or copolymerized with the benzyl (meth)acrylate and they may be homopolymerized or copolymerized. These monomers can also be incorporated as component (b) to be described later.

Monomers that can be used with advantage include (meth)acrylate esters, ethylenically unsaturated carboxylic acids and other copolymerizable monomers. Specific examples include styrene, benzyl (meth)acrylate, cyclohexyl (meth)acrylate, phenoxyethyl (meth)acrylate, phenoxypolyethylene glycol (meth)acrylate, nonylphenoxypolyethylene (glycol) mono(meth)acrylate, nonylphenoxylpolypropylene mono (meth)acrylate, 2-hydroxy-3-phenoxypropyl acrylate, 2-acryloyloxyethyl phthalate, 2-acryloyloxethyl-2-hydroxyethyl phthalate, 2-methacryloyloxyethyl-2-hydroxypropyl phthalate, methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, tert-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, 3-ethylhexyl (meth)acrylate, ethylene glycol mono(meth)acrylate, glycerol (meth)acrylate, dipentaerythritol mono(meth)acrylate, dimethylaminoethyl (meth)acrylate, diethylaminoethyl (meth)acrylate, tetrahydrofurfuryl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, β-furyl(meth)acrylic acid, crotonic acid, propiolic acid, cinnamic acid, α-cyanocinnamic acid, maleic acid, maleic anhydride, monomethyl maleate, monoethyl maleate, monoisopropyl maleate, fumaric acid, itaconic acid, itaconic anhydride, citraconic acid and citraconic anhydride. Among these, (meth)acrylic acid and methyl (meth)acrylate are used with particular advantage.

The above-mentioned (meth)acrylate esters may be replaced by fumarate esters, maleate esters, crotonate esters and itaconate esters. Other copolymerizable monomers that can be used in the invention include α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, vinyl acetate, vinyl butyrate, vinyl propionate, (meth)acrylamide, (meth)acrylonitrile, isoprene, chloroprene, 3-butadiene and vinyl-n-butylether.

In addition to the polymers or copolymers of benzyl (meth)acrylate and the monomers listed above, component (a) may contain cellulose or its derivatives such as hydroxymethylcellulose, hydroxyethylcellulose, hydroxypropylcellulose, carboxymethylcellulose, carboxyethylcellulose and carboxyethylmethylcellulose, as well as copolymers of cellulose or its derivatives and ethylenically unsaturated carboxylic acids, (meth)acrylate compounds, etc. Other compounds that can additionally be incorporated include: poly(vinyl alcohol)s such as polybutyral resin which is the reaction product between poly(vinyl alcohol) and butylaldehyde; polyesters prepared by ring-opening polymerization of lactones, such as δ-valerolactone, ε-caprolactone, β-propiolactone, α-methyl-β-propiolactone, β-methyl-β-propiolactone, α,α-dimethyl-β-propiolactone and β,β-dimethyl-β-propiolactone; polyesters prepared by condensation reaction between one or more diols selected from among alkylene glycols (e.g., ethylene glycol, propylene glycol, diethylene glycol, triethylene glycol, dipropylene glycol and neopentyl glycol) and dicarboxylic acids (e.g., maleic acid, fumaric acid, glutaric acid and adipic acid); polyethers such as polyethylene glycol, polypropylene glycol, polytetramethylene glycol and polypentamethylene glycol; and polycarbonates which are the reaction products between diols (e.g., bisphenol A, hydroquinone and dihydroxycyclohexane) and carbonyl compounds (e.g., diphenyl carbonate, phosgene and succinic anhydride).

From the viewpoint of assuring good developability with alkali, the carboxyl group is preferably incorporated in component (a) and this may be achieved by radical polymerization between a monomer having the carboxyl group and other monomer(s). In this case, (meth)acrylic acid is preferably incorporated.

Component (a) may consist of one or more species. While benzyl (meth)acrylate may be copolymerized with two or more monomers to prepare component (a), a (meth)acrylic acid/benzyl (meth)acrylate copolymer may be given as the most preferable embodiment of the invention. Using this copolymer as component (a) is particularly effective in providing improved resistance to plating and dry etching. The polymerization ratio of (meth)acrylic acid to benzyl (meth)acrylate is preferably in the range of from 5:95 to 50:50, more preferably in the range of from 10:90 to 30:70. The mode of copolymerization is not limited in any particular way and examples are random copolymerization and block copolymerization.

To the extent that will not compromise the intended advantages of the invention, a variety of high-molecular weight resin compounds conventionally used as binder polymers in photosensitive resin compositions may be added as component (a) and they include, for example, (meth)acrylic resins, styrenic resins, epoxy resins, amide resins, amide-epoxy resins, alkyd resins, phenolic resins, phenol novolac resins and cresol novolac resins.

In order to meet various requirements such as mechanical strength and alkali developability, the mass average molecular weight of component (a) preferably ranges from about $2\times10^4$ to about $30\times10^4$, with the range of $4\times10^4$ to $20\times10^4$ being particularly preferred. In order to meet requirements including developability and chemical resistance, acid values of 30-300 mg/KOH are preferred and the more preferred range is 100-200 mg/KOH. With acid values less than 30 mg/KOH, development failure may occur; acid values higher than 300 mg/KOH are also undesirable since flexibility loss or poor water resistance may occur.

Component (a) is preferably incorporated in an amount (as solids content) of 40-80 parts by mass per 100 parts by mass of the sum of component (a) and component (b) to be described later. If the amount of component (a) is too small, the photocured pattern tends to be so brittle that only a defective dry film is formed. On the other hand, if the amount of component (a) is too large, low sensitivity and other disadvantages will result.

The photopolymerizable compound that is used as component (b) is exemplified by compounds obtained by reacting polyols with α,β-unsaturated carboxylic acids, compounds having a bisphenol skeleton, compounds obtained by reacting glycidyl group containing compounds with α,β-unsaturated carboxylic acids, urethane monomers, nonylphenyldioxylene (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate and alkyl (meth)acrylate esters. Additional compounds that can be used are the monomers listed above as candidates for incorporation in component (a).

Preferred examples of the α,β-unsaturated carboxylic acids include but are not limited to (meth)acrylic acid.

Examples of the compounds obtained by reacting polyols with α,β-unsaturated carboxylic acids include ethylene glycol di(meth)acrylate, polyethylene glycol di(meth)acrylate (the number of ethylene groups: 2-14), propylene glycol di(meth)acrylate, polypropylene glycol di(meth)acrylate (the number of propylene groups: 2-14), polyethylene-polypropylene glycol di(meth)acrylate (the number of ethylene groups: 2-14) (the number of propylene groups: 2-14), trimethylolpropane di(meth)acrylate, trimethylolpropane tri(meth)acrylate, trimethylolpropaneethoxy tri(meth)acrylate, trimethylolpropanediethoxy tri(meth)acrylate, trimethylolpropanetriethoxy tri(meth)acrylate, trimethylolpropanetetraethoxy tri(meth)acrylate, trimethylolpropanepentaethoxy tri(meth)acrylate, tetramethylolmethane tri(meth)acrylate, tetramethylolmethane tetra(meth)acrylate, tetramethylolpropane tetra(meth)acrylate, pentaerythritol tri(meth)acrylate, pentaerythritol tetra(meth)acrylate, pentaerythritol penta(meth)acrylate, dipentaerythritol penta(meth)acrylate, dipentaerythritol hexa(meth)acrylate, as well as lower alkoxylated (e.g. ethoxylated or methoxylated) derivatives thereof. Among such derivatives, ethoxylated polypropylene glycol dimethacrylate may be mentioned as a particularly preferred example.

Examples of the compounds having a bisphenol skeleton include bisphenol A compounds, bisphenol F compounds and bisphenol S compounds. Preferred in the present invention are bisphenol A compounds, in particular, 2,2-bis[4-{(meth)acryloxypolyethoxy}phenyl]propanes (the number of ethoxy groups: 2-14). Specific examples include but are not limited to 2,2-bis[4-{(meth)acryloxydiethoxy}phenyl]propane, 2,2-bis[4-{(meth)acryloxytriethoxy}phenyl]propane, 2,2-bis[4-{(meth)acryloxypentaethoxy}phenyl]propane and 2,2-bis[4-{(meth)acryloxydecaethoxy}phenyl]propane. Among these compounds, 2,2-bis[4-(methacryloxydiethoxy)phenyl]propane and 2,2-bis[4-(methacryloxypentaethoxy)phenyl]propane are commercially available as BPE-200 and BPE-500, respectively (both being manufactured by Shin-Nakamura Chemical Co., Ltd.).

Examples of the glycidyl group containing compounds include but are not limited to triglycerol di(meth)acrylate. Triglycerol diacrylate is commercially available as 80MFA (product of Kyoeisha Chemical Co., Ltd.).

Examples of the urethane monomers include the following: the products of addition reaction between (meth)acrylic monomers having an OH group at β-site and isophorone diisocyanate, 2,6-toluene diisocyanate, 2,4-toluene diisocyanate and 1,6-hexamethylene diisocyanate; as well as tris [(meth)acryloxytetraethylene glycol isocyanate]hexamethylene isocyanurate, EO modified urethane di(meth)acrylate, and EO-PO modified urethane di(meth)acrylate.

Examples of the alkyl (meth)acrylate esters include methyl (meth)acrylate, ethyl (meth)acrylate, butyl (meth)acrylate and 2-ethylhexyl (meth)acrylate.

In a particularly preferred embodiment of the present invention, at least one compound selected from the group consisting of the compounds having a bisphenol skeleton, the compounds obtained by reacting glycidyl group containing compounds with α,β-unsaturated carboxylic acids and the compounds obtained by reacting polyols with α,β-unsaturated carboxylic acids or lower alkoxylated derivatives thereof may be used as component (b). Using these compounds as component (b) contributes to effective improvement in sensitivity.

Component (b) is preferably incorporated in an amount (as solids content) of 20-60 parts by mass per 100 parts by mass of the sum of component (a) and component (b). If the amount of component (b) is too small, sensitivity drop and other disadvantages will occur. On the other hand, if the amount of component (b) is too large, only a defective dry film will form. One or more species of component (b) may be used.

In the present invention, a photopolymerization initiator based on a hexarylbisimidazole compound is used as component (c). This is particularly effective in providing improved adhesion and resolution. The hexarylbisimidazole compound refers to imidazole dimer compounds in which all hydrogen atoms bound to the three carbon atoms on the imidazole ring are replaced by aryl groups (which may be substituted or unsubstituted). Specific examples include 2,4,5-triarylimidazole dimmers, such as 2-(o-chlorophenyl)-4,5-diphenylimidazole dimer, 2-(o-chlorophenyl)-4,5-di(methoxyphenyl) imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer. Among these, 2-(o-chlorophenyl)-4,5-diphenylimidazole dimer is particularly preferred.

To the extent that will not compromise the advantages of the invention, a variety of compounds conventionally used as photopolymerization initiators in photosensitive resin compositions may optionally be added as component (c). Such compounds include: aromatic ketones, such as benzophenone, N,N'-tetramethyl-4,4'-diaminobenzophenone, N,N'-tetraethyl-4,4'-diaminobenzophenone, 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholino-propanone-1; quinones, such as 2-ethylanthraquinone, phenanthrenequinone, 2-tert-butylanthraquinone, octamethylanthraquinone, benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone; benzoin ether compounds, such as benzoin methyl ether, benzoin ethyl ether and benzoin phenyl ether; benzoin compounds, such as benzoin, methylbenzoin and ethylbenzoin; benzyl derivatives, such as benzyl dimethyl ketal; acridine derivatives such as 9-phenylacridine and 1,7-bis(9,9'-acridinyl)heptane; and N-phenylglycine and coumarin compounds.

Component (c) is preferably incorporated in an amount (as solids content) of 0.001-60 parts by mass per 100 parts by mass of the sum of component (a) and component (b). If the amount of component (c) is too small, insufficient sensitivity occurs. On the other hand, if the amount of component (c) is too large, the composition absorbs an increased amount of exposing light on the surface and the photocuring of the interior tends to be inadequate. One or more species of component (c) may be used.

According to the invention, the use of components (a)-(c) contributed to the making of a photosensitive resin composition that had particularly high resistance to plating and dry etching, as well as exhibiting good resolution and adhesion. In addition to components (a)-(c), a light-initiated color former may be incorporated as component (d) and this contributes to providing higher sensitivity as well as a further improvement in resolution.

A triphenylmethane light-initiated color former is preferred as component (d). Specific examples include but are not limited to tris[4-(dimethylamino)phenyl]methane (generally known as leuco crystal violet).

To the extent that will not compromise the advantages of the invention, a variety of compounds (e.g., tribromomethylphenylsulfone) that are conventionally used as light-initiated color formers in photosensitive resin compositions may optionally be added.

If component (d) is to be incorporated, its amount (as solids content) ranges preferably from 0.01 to 5 parts by mass, more preferably from 0.05 to 2 parts by mass, per 100 parts by mass of the sum of component (a) and component (b). One or more species of component (d) may be used.

The photosensitive resin composition of the invention may further incorporate optional components including dyes (e.g. malachite green), inhibitors of thermal color formation, plasticizers (e.g., p-toluenesulfoneamide), pigments, fillers, antifoamers, flame retardants, stabilizers, tackifiers (e.g. benzotriazole and mercaptobenzimidazole), leveling agents, release promoters, antioxidants, perfume, imaging agents, thermal crosslinkers, etc.

For particular purposes such as viscosity adjustment, the photosensitive resin composition may optionally be dissolved in solvents, such as methanol, ethanol, acetone, methyl ethyl ketone, methyl cellosolve, ethyl cellosolve, toluene and N,N-dimethylformamide, and used as solution having solids content of from about 30 to 60% by mass.

The photosensitive resin composition of the invention is advantageously used to form photosensitive dry films. To this end, the photosensitive resin composition is applied to a support film and dried to form a photosensitive resin layer. The photosensitive resin layer is then laminated with an overlying protective film to make a photosensitive dry film.

The support film carries the photosensitive resin layer and is not limited to any particular type as long as it has an appropriate degree of flexibility. Preferably, it has a surface roughness (Ra) of no more than 10 nm and a surface resistivity of no more than $10^{12}\Omega$. If the surface roughness (Ra) exceeds 10 nm, sidewalls of elements of a photoresist pattern may sometimes become jaggy (to have streaks that run vertically on lateral surfaces of the photoresist pattern elements). If the surface resistivity exceeds $10^{12}\Omega$, static electricity may sometimes cause tiny particles to be adsorbed on the surface. Either case is not preferred from a process viewpoint. The surface roughness (Ra) is specified in JIS B0601 and the surface resistivity in JIS K6911.

Specifically, a polyethylene terephthalate (PET) film about 15-125 μm thick may preferably be used as the support film. Other synthetic resin films are also preferred and they may be exemplified by polyethylene (PE), polypropylene (PP), polycarbonate and polyvinyl chloride films.

The protective film is for protecting the surface of the photosensitive resin layer in a stable state during storage and it is stripped away before using the photosensitive dry film. Therefore, it is required to have an appropriate degree of releasability such that it will not easily detach during storage but can be easily detached before using the photosensitive dry film. Materials that meet this need and which can be used with advantage include PET films, PP films, PE films, etc. that have been silicone-coated or baked to thicknesses of about 15-125 μm.

To form the photosensitive resin layer, the components of the photosensitive resin composition of the invention are dissolved in a solvent and the resulting solution is applied to the support film by an applicator, a bar coater, a roll coater, a curtain flow coater or by other suitable device to give a dry film thickness ranging preferably from about 5 to about 30 μm, more preferably from about 10 to about 25 μm. If the photosensitive resin layer is too thin, there is an increased chance of nicking and discontinuity in metallization. On the other hand, if the photosensitive resin layer is too thick, resolution may potentially drop.

The following is a non-limiting example of the method for using the photosensitive dry film of the invention.

First, the photosensitive dry film of the invention is stripped away of the protective film; then, the bare photosensitive resin layer is placed against a work (substrate) and the photosensitive dry film is allowed to adhere to the substrate. The adhering step may typically be performed by thermocompression, in which the photosensitive dry film is placed over the preheated substrate and compressed. The photosensitive resin layer formed from the photosensitive resin composition of the invention has the advantage of exhibiting very good adhesion to the work (substrate).

In the next step, the photosensitive resin layer carrying the support film is exposed selectively, either through a mask or by direct writing.

After the exposure, the support film is detached and development is performed such that the unexposed areas of the photosensitive resin layer are selectively removed to form a pattern in which the photosensitive resin layer remains intact in the exposed areas. Liquid developers that can be used are alkali liquid developers which are exemplified by aqueous solutions of alkalis including: hydroxides, carbonates, bicarbonates, phosphates and pyrophosphates of alkali metals such as lithium, sodium and potassium; primary amines, such as benzylamine and butylamine; secondary amines, such as dimethylamine, dibenzylamine and diethanolamine; tertiary amines such as trimethylamine, triethylamine and triethanolamine; cyclic amines, such as morpholine, piperazine and pyridine; polyamines, such as ethylenediamine and hexamethylenediamine; ammonium hydroxides, such as tetraethylammonium hydroxide, trimethylbenzylammonium hydroxide and trimethylphenylbenzylammonium hydroxide; and sulfonium hydroxides, such as trimethylsulfonium hydroxide, diethylmethylsulfonium hydroxide and dimethylbenzylsulfonium hydroxide. Other examples are general-purpose alkali liquid developers, such as choline and silicate containing buffers. Also useful are organic solvents including: ketones, such as acetone, methyl ethyl ketone, cyclohexanone, methyl isoamyl ketone and 2-heptanone; polyols, such as ethylene glycol, propylene glycol, diethylene glycol, ethylene glycol monoacetate, propylene glycol monoacetate and diethylene glycol monoacetate, as well as derivatives thereof formed by reacting them with monomethyl ether, monoethyl ether, monopropyl ether, monobutyl ether, monophenyl ether, etc.; and esters, such as ethyl lactate, methyl acetate, ethyl acetate, butyl acetate, methyl pyruvate, ethyl pyruvate, methyl methoxypropionate, and ethyl ethoxypropionate.

By using the photosensitive resin composition of the invention, one can form photoresist patterns that exhibit high enough resolution to assure good fidelity to extremely fine-line mask patterns.

Subsequently, with the patterned residual photosensitive resin layer (photoresist pattern) used as a mask, the substrate is wet- or dry-etched or, alternatively, the areas between elements of the photoresist pattern are plated or otherwise processed to form a metallization pattern. These treatments can be performed in the usual manner. For example, dry etching may be performed in an atmosphere filled with etching gases such as $CF_4$, $CHF_4$ and He but this is not the sole case of the invention. Plating may be performed by electroplating or electroless-plating techniques.

The photosensitive resin composition of the invention exhibits particularly high resistance to plating and dry etching.

After the above-described process, the photoresist pattern is stripped away with aqueous solutions of sodium hydroxide, potassium hydroxide, organic amines, etc. at pHs of about 12 to 14.

EXAMPLES

The present invention is now described in greater detail by reference to the following examples, which are provided for illustrative purposes only and are by no means intended to limit the invention.

[Preparing Photosensitive Resin Compositions]

Photosensitive resin compositions were prepared as solution according to the recipes shown in Table 1 below. In Table 1, the amounts of respective components are indicated in parts by mass. In Table 1, the values for the amounts of binder polymers are expressed in terms of solids content.

TABLE 1

| | | Examples | | | | | | | | Comparative Examples | | | |
|---|---|---|---|---|---|---|---|---|---|---|---|---|---|
| Components[Notes] | | 1 | 2 | 3 | 4 | 5 | 6 | 7 | 8 | 1 | 2 | 3 | 4 |
| Binder polymer | (a-1) | 100 | 100 | 100 | 100 | 90 | 150 | 100 | 100 | — | — | — | — |
| | (a-2) | — | — | — | — | — | — | — | — | 100 | 100 | 100 | 100 |
| Photo- | (b-1) | 80 | — | — | — | 80 | 80 | — | — | 80 | — | — | 80 |
| polymerizable | (b-2) | — | 70 + 10 | 40 + 40 | — | — | — | — | 40 + 40 | — | 40 + 40 | — | — |
| compound | (b-3) | — | — | — | 80 | — | — | — | — | — | — | 80 | — |
| | (b-4) | — | — | — | — | — | — | 80 | — | — | — | — | — |

TABLE 1-continued

| | Components[Notes] | Examples | | | | | | | | Comparative Examples | | | |
|---|---|---|---|---|---|---|---|---|---|---|---|---|---|
| | | 1 | 2 | 3 | 4 | 5 | 6 | 7 | 8 | 1 | 2 | 3 | 4 |
| Photopolymeriza- | (c-1) | 3 | 3 | 3 | 3 | 3 | 3 | 3 | 3 | 3 | 3 | 3 | — |
| tion initiator | (c-2) | — | — | — | — | — | — | — | — | — | — | — | 3 |
| | (c-3) | — | — | — | — | — | — | — | — | — | — | — | 8 |
| Light-initiated color former | (d-1) | 0.1 | 0.1 | 0.1 | 0.1 | 0.1 | 0.1 | 0.1 | 0.1 | 0.1 | 0.1 | 0.1 | 0.1 |
| Others | Malachite green (dye) | 0.05 | 0.05 | 0.05 | 0.05 | 0.05 | 0.05 | 0.05 | 0.05 | 0.05 | 0.05 | 0.05 | 0.05 |
| | Methyl ethyl ketone | 5 | 5 | 5 | 5 | 5 | 5 | 5 | 5 | 5 | 5 | 5 | 5 |
| Surface roughness of support film (Ra, nm) | | 4 | 4 | 4 | 4 | 4 | 4 | 4 | 25 | 4 | 4 | 4 | 4 |
| Chargeability | | ○ | ○ | ○ | ○ | ○ | ○ | ○ | Δ | ○ | ○ | ○ | ○ |
| Exposure (mJ/cm$^2$) (sensitivity) | | 80 | 70 | 120 | 40 | 70 | 120 | 80 | 120 | 80 | 120 | 40 | 80 |
| Adhesion (μm) | | 15 | 15 | 20 | 20 | 20 | 15 | 15 | 20 | 20 | 25 | 20 | 30 |
| Resolution (μm) | | 15 | 15 | 15 | 15 | 15 | 20 | 15 | 15 | 15 | 20 | 20 | 50 |
| Jaggies on sidewalls of photoresist | | ○ | ○ | ○ | ○ | ○ | ○ | ○ | Δ | ○ | ○ | ○ | ○ |
| Plating resistance | | ○ | ○ | ○ | ○ | ○ | ○ | Δ | ○ | X | X | X | X |
| Dry etching resistance | | ○ | ○ | ○ | ○ | ○ | ○ | ○ | ○ | X | X | — | X |

Notes):
(a-1): benzyl methacrylate/methacrylic acid copolymer(polymerization ratio, 80/20; mass av. mol. wt., 60,000; 40% MEK solution)
(a-2): methyl methacrylate/methacrylic acid copolymer (polymerization ratio, 80/20; mass av. mol, wt., 60,000; 40% MEK solution)
(b-1): 2,2-bis(4-(methacryloxypentaethoxy)phenyl)propene [BPE-500]
(b-2): 2,2-bis(4-(methacryloxypentaethoxy)phenyl)propane + triglyerol diacrylate [BPE-500 + 80MFA]
(b-3): ethoxylated polypropylene glycol (mol. wt., 700) dimethacrylate
(b-4): (2,2-bis(4-(methacryloxydiethoxy)phenyl)propane [BPE-200]
(c-1): 2-(o-chlorophenyl)-4,5-diphenylimidazole dimer
(c-2): diethyl thioxanthone
(c-3): 2-methyl-1-[4-(methylthio)phenyl]-2-(4-morpholino)-1-propanone
(d-1): tris[4-(dimethylamino)phenyl]methane Examples 1-8 and Comparative Examples 1-4

Solutions were prepared from photosensitive resin compositions dissolved in the amounts indicated in the columns in Table 1 for Examples 1-7 and Comparative Examples 1-4 and they were uniformly applied to PET films 16 μm thick (R340G16 of Mitsubishi Polyester Film Corp.; surface roughness (Ra), 4 nm; surface resistivity, $8.1 \times 10^{10} \Omega$).

A solution was also prepared from a photosensitive resin composition dissolved in the amount indicated in the "Example 8" column and it was uniformly applied to a PET film 16 μm thick (R209 of Mitsubishi Polyester Film Corp.; surface roughness (Ra), 25 nm; surface resistivity, $2.0 \times 10^{15} \Omega$).

After the application, the PET films were dried in a hot-air convection dryer at 75° C. for about 5 minutes and laminated with protective films E200 (20-μm thick PP films of Oji Paper Co., Ltd.) to make photosensitive dry films. Each of the photosensitive resin layers had a dry thickness of 25 μm.

The photosensitive dry films thus prepared in Examples 1-8 and Comparative Examples 1-4 were tested by the following methods to evaluate chargeability, sensitivity (amount of exposure), resolution, adhesion, jaggies on sidewalls of photoresist pattern elements, plating resistance, and dry etching resistance. The results are also shown in Table 1.

[Chargeability]

After preparing the photosensitive dry films, the surface of each support film was observed both by the naked eye and under a microscope and evaluated by the following criteria.

(Rating)

○: Nothing was found to have been adsorbed.

Δ: Static electricity caused some adsorption but that was not deleterious to the formation of a photoresist pattern.

[Sensitivity (Amount of Exposure), Resolution and Adhesion]

A two-sided copper clad prepreg 1.6 mm thick was dipped in a 2 mass % aqueous sulfuric acid solution for 1 minute (at 25° C.) and thereafter rinsed with water and dried to make a substrate. Being stripped away of the protective film, each of the photosensitive dry films was laminated to the substrate under the following conditions: roll temperature, 105° C.; roll cylinder pressure, 0.29 MPa; speed, 2 m/min.

Each of the thus prepared substrates was placed in vacuum contact with a step tablet (Stouffer 21) and a test pattern consisting of 5-50 μm lines/spaces, exposed to a 3.5 kW ultrahigh-pressure mercury lamp (Hakuto Co., Ltd.), stripped of the support film and spray developed with 1.0 mass % sodium carbonate for 24 seconds to form a photoresist pattern.

After the development, the amount of illumination (mJ/cm$^2$) required to give exposure for 5 steps on the step tablet (STOUFFER STEP TABLET of Stouffer Industries) was measured to estimate the sensitivity of each photosensitive resin layer. The results are shown in Table 1. A good exposure which depends on circumstances is generally no more than 1000 mJ/cm$^2$.

To evaluate adhesion, resolution, jaggies on sidewalls of photoresist pattern elements and plating resistance, the substrate was examined from above with a microscope.

[Evaluation of Adhesion]

After the formation of the photoresist pattern, a minimum linewidth (μm) of the intact lines (the feature size of the photoresist pattern) was measured.

[Evaluation of Resolution]

After the formation of the photoresist pattern, a minimum width (μm) of the resolved spaces (the spacing between adjacent elements of the photoresist pattern) was measured.

[Jaggies on Sidewalls of Photoresist Pattern Elements]

After the formation of the photoresist pattern, lateral surfaces of its elements were examined to see whether they were any jaggy (to have streaks that ran vertically on those lateral surfaces).

(Rating)

○: No jaggies were found.

Δ: Some jaggies were found but they did no harm to the shape of the photoresist pattern.

X: Many jaggies were found and they prevented faithful reproduction of the photoresist pattern.

[Plating Resistance]

The photoresist pattern subjected to the above evaluations was treated with an acidic cleaner, washed under running water for 1 minute and then dipped in an aqueous sodium persulfate solution (100 g/L) for 2 minutes. After washing under running water for an additional minute, the pattern was dipped in a 10% aqueous sulfuric acid bath for 1 minute, plated in a copper plating bath [copper sulfate pentahydrate, 60 g/L; sulfuric acid, 180 g/L; COPPERACID GS (product of Atotech Company), 20 mL/L; HCl, 100 mg/L; boric acid, 45 g/L; gloss agent, 30 mL/L], rinsed with water, dipped in 10% sulfuric acid and rinsed with water. Thereafter, nickel plating was done at 3 A/dm$^2$ for 10 minutes at 50° C., rinsed with water, dipped in 10% sulfuric acid and rinsed with water.

Subsequently, gold plating (AUTRONEX CI of Electroplating Engineers of Japan Ltd.) was done at 2 A/dm$^2$ for 6 minutes at 30° C. The deposited gold plate was rinsed with water and dried.

Thereafter, the photoresist pattern was stripped with a 3% aqueous sodium hydroxide solution (at 50° C.) and the underlying substrate was examined from above with an optical microscope. The plating resistance of the photoresist film was evaluated by checking the 50-μm plating pattern to see if the gold plate had eaten into the substrate surface.

(Rating)

○: No part of the plate was found to have eaten into the substrate surface.

Δ: The plate was found to have eaten into the substrate surface by a depth of less than 5 μm.

X: The plate was found to have eaten into the substrate surface by a depth 5 μm or more.

[Dry Etching Resistance]

Being stripped away of the protective film, each of the photosensitive dry films was laminated onto an oxidized silicon wafer. The bare photoresist film was subjected to dry etching on TCE3612 (dry etching apparatus of Tokyo Ohka Kogyo Co., Ltd.) with an etching gas mixture of $CF_4$:$CHF_4$:He (40:40:160) under the following conditions: pressure, 300 mTorr; output power, 500 W; temperature, 25° C. The etching rate was measured and converted to a relative value, with the etching rate on the photoresist film from the recipe for Comparative Example 3 being taken as unity. The smaller the relative etching rate, the more resistant the photoresist film was to dry etching.

(Rating)

○: Not more than 0.9 in terms of relative value.

X: More than 0.9 in terms of relative value.

As described above in detail, using the photosensitive resin composition of the invention, one could obtain photosensitive dry films that exhibited high resistance to plating and dry etching, as well as maintaining good resolution and adhesion.

INDUSTRIAL APPLICABILITY

Photosensitive dry films using the photosensitive resin composition of the invention exhibit particularly high resistance to plating and dry etching, as well as maintaining good properties such as high resolution and good adhesion. Therefore, those photosensitive dry films are applicable with advantage to the manufacture of today's semiconductor devices such as printed boards and plastic packages which are seeing a growing reduction in feature size.

The invention claimed is:

1. A photosensitive dry film prepared by applying to a support film a photosensitive resin composition, drying the applied composition to form a photosensitive resin layer and overlying the photosensitive resin layer with a protective film, wherein the photosensitive resin composition comprises
(a) a binder polymer based on a copolymer containing benzyl (meth)acrylate as a building block, (b) a photopolymerizable compound having at least one polymerizable ethylenically unsaturated group in the molecule, (c) a photopolymerization initiator based on a hexarylbisimidazole compound and (d) a light-initiated color former, wherein:

component (a) is a copolymer obtained from monomers selected from the group consisting of (meth)acrylic acid and benzyl (meth)acrylate, wherein the polymerization ratio of (meth)acrylic acid to benzyl (meth)acrylate ranges from 5:95 to 50:50, and component (b) is at least one compound selected from the group consisting of 2,2-bis[4-[(meth)acryloxypolyethoxy]phenyl]propanes (the number of ethoxy groups: 2-14), triglycerol di(meth)acrylate and ethoxylated polypropylene glycol di(meth)acrylate.

2. The photosensitive dry film according to claim 1, wherein component (d) is a triphenylmethane color former.

3. The photosensitive dry film according to claim 1, wherein the support film has a surface roughness (Ra) of no more than 10 nm and a surface resistivity of no more than $10^{12}$ Ω.

* * * * *